(12) United States Patent
Lee et al.

(10) Patent No.: US 10,201,108 B2
(45) Date of Patent: Feb. 5, 2019

(54) ELECTRONIC CONTROL APPARATUS FOR VEHICLE

(71) Applicant: Hyundai Autron Co., Ltd., Seongnam-si (KR)

(72) Inventors: Jun Ho Lee, Seoul (KR); Hyung Joon Moon, Seoul (KR); Seung Mok Song, Seongnam-si (KR); Ju Hyung Lee, Suwon-si (KR); Sun Jae Yang, Gunpo-si (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 391 days.

(21) Appl. No.: 14/139,858

(22) Filed: Dec. 23, 2013

(65) Prior Publication Data

US 2014/0334116 A1 Nov. 13, 2014

(30) Foreign Application Priority Data

May 10, 2013 (KR) ........................ 10-2013-0053230

(51) Int. Cl.
*H05K 7/14* (2006.01)
*B60R 16/023* (2006.01)
(Continued)

(52) U.S. Cl.
CPC ......... *H05K 7/1427* (2013.01); *B60R 16/023* (2013.01); *B60R 16/0238* (2013.01);
(Continued)

(58) Field of Classification Search
CPC ..... H05K 7/1427; H05K 5/0052; H05K 5/061
See application file for complete search history.

(56) References Cited

U.S. PATENT DOCUMENTS

| 6,407,925 | B1 * | 6/2002 | Kobayashi | ........... | H05K 5/0052 |
| | | | | | 200/61.88 |
| 7,561,435 | B2 * | 7/2009 | Kamoshida | .......... | H05K 5/0052 |
| | | | | | 174/50.5 |

(Continued)

FOREIGN PATENT DOCUMENTS

| CN | 201995255 U | 9/2011 |
| CN | 102833983 A | 12/2012 |

(Continued)

OTHER PUBLICATIONS

Office Action, Korea Intellectual Property Office, dated May 1, 2014.

*Primary Examiner* — Binh B Tran
*Assistant Examiner* — Douglas R Burtner
(74) *Attorney, Agent, or Firm* — Baker McKenzie; Hyunho Park

(57) ABSTRACT

The present disclosure relates to an electronic control apparatus for a vehicle, and the electronic control apparatus of the present disclosure includes: an electronic control element which includes a printed circuit board (PCB) and electronic components installed on a surface of the PCB; a cover and a base which accommodate the electronic control element; and a connector which is coupled to the electronic control element, wherein a front end portion having a protrusion is formed at an edge of the cover so that the PCB is inserted and mounted between the protrusion of the cover and an edge of the base, a projection portion is formed at a rear end portion of the edge of the base where the cover and the base come into contact with each other, and the cover and the projection portion of the base come into contact with each other so as to form a predetermined space between the front end portion and the rear end portion so that a sealing member is inserted into the predetermined space.

3 Claims, 3 Drawing Sheets

(51) Int. Cl.
*H05K 5/00* (2006.01)
*H05K 5/06* (2006.01)

(52) U.S. Cl.
CPC ....... *B60R 16/0239* (2013.01); *H05K 5/0052* (2013.01); *H05K 5/061* (2013.01)

(56) References Cited

U.S. PATENT DOCUMENTS

| | | | | |
|---|---|---|---|---|
| 7,563,992 B2* | 7/2009 | Lawlyes | ................ | H05K 5/062 174/561 |
| 7,570,496 B2* | 8/2009 | Chen | ...................... | H05K 9/006 174/350 |
| 8,014,158 B2* | 9/2011 | Kojinna | ............... | H05K 5/0052 174/50.5 |
| 8,139,376 B2* | 3/2012 | Sanronna | ............... | H05K 5/061 174/350 |
| 8,305,763 B2* | 11/2012 | Kato | ...................... | H05K 5/006 361/730 |
| 8,670,240 B2* | 3/2014 | Hashimoto | ........ | H05K 7/20854 361/720 |
| 9,468,119 B2* | 10/2016 | Beck | .................... | H05K 5/0052 |
| 2001/0039130 A1 | 11/2001 | Nakamura et al. | | |
| 2003/0025393 A1* | 2/2003 | Mayer | .................. | H05K 5/0069 307/9.1 |
| 2004/0235317 A1* | 11/2004 | Schiefer | ................ | H05K 1/181 439/76.2 |
| 2006/0044768 A1* | 3/2006 | Mizutani | .............. | H05K 7/1417 361/752 |
| 2008/0123316 A1 | 5/2008 | Chen et al. | | |
| 2011/0147246 A1* | 6/2011 | Cheng | .................... | H05K 5/061 206/320 |
| 2012/0320544 A1* | 12/2012 | Ohhashi | ............... | H05K 5/0052 361/752 |

FOREIGN PATENT DOCUMENTS

| | | |
|---|---|---|
| JP | H11-233988 A | 8/1999 |
| JP | 2010225452 A | 10/2010 |
| JP | 2012227217 A | 11/2012 |

* cited by examiner

ELECTRONIC CONTROL APPARATUS FOR VEHICLE

CROSS-REFERENCE TO RELATED APPLICATIONS

This application is based on and claims priority from Korean Patent Application No. 10-2013-0053230, filed on May 10, 2013, with the Korean Intellectual Property Office, the disclosure of which is incorporated herein in its entirety by reference.

TECHNICAL FIELD

The present disclosure relates to an electronic control apparatus for a vehicle, and more particularly, to an electronic control apparatus such as an electronic control unit (ECU) controlling an engine for a vehicle and has improved performance of sealing between a cover and a base.

BACKGROUND

In general, an electronic control apparatus such as an ECU, which electronically controls various types of devices, is equipped in a vehicle. The electronic control apparatus receives information from sensors or switches that are installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The cover and the base are assembled together with the PCB while covering the PCB, and particularly, the connector, which is interposed between the cover and the base when the cover and the base are assembled, forms a sealing structure with the cover side and the base side.

Heating elements are provided on a top side of the PCB, and a heat radiating paste is attached to a bottom side of the PCB. The cover and the base are fastened by a screw.

The electronic control apparatus includes a high integrated control circuit means and thus requires a predetermined sealing structure that may prevent external moisture or foreign substances from flowing into the electronic control apparatus, and the electronic control apparatus adopts a sealing structure in which the cover and the base are typically assembled together with the connector in a state in which sealing materials are inserted on binding parts between the cover and the base and the connector so as to protect the PCB and the like in the electronic control apparatus.

U.S. Pat. No. 6,573,448 discloses a sealing structure of an electronic control apparatus in which a sealing compound is displaced in binding parts between a cover, a base, and a connector.

Japanese Patent No. 4470980 discloses a sealing structure of an electronic control apparatus including upper and lower cases, a printed circuit board, a connector, and a waterproof material, in which the waterproof material is inserted between groove portions of the upper and lower cases.

However, the sealing structures, which are applied to electronic control apparatuses in the related art, have a structure in which a sealing member is applied on binding parts between a groove or a projection at a connector side and a projection or a groove of a cover and a base, and thereby, there are problems in that a sealing area is not sufficiently secured, and sealing performance deteriorates.

SUMMARY

The present disclosure has been made in an effort to provide an electronic control apparatus which provides a sealing structure that may secure a sufficient sealing area between a cover and a base, thereby improving sealing performance.

An exemplary embodiment of the present disclosure provides an electronic control apparatus for a vehicle, including: an electronic control element which includes a printed circuit board (PCB) and electronic components installed on a surface of the PCB; a cover and a base which accommodate the electronic control element; and a connector which is coupled to the electronic control element, wherein a front end portion having a protrusion is formed at an edge of the cover so that the PCB is inserted and mounted between the protrusion of the cover and an edge of the base, a projection portion is formed at a rear end portion of the edge of the base where the cover and the base come into contact with each other, and the cover and the projection portion of the base come into contact with each other so as to form a predetermined space between the front end portion and the rear end portion so that a sealing member is inserted into the predetermined space.

The protrusion of the cover may be formed to be inclined at a predetermined angle.

The cover, the PCB, and the base may be bonded at the predetermined space through the sealing member.

Another exemplary embodiment of the present disclosure provides an electronic control apparatus for a vehicle, including: an electronic control element which includes an electronic control board which electrically controls each part of a vehicle, and a heating element which is positioned on a surface of the electronic control board; a cover and a base which accommodate the electronic control element; and a connector which is coupled to the electronic control element, in which the cover and the base come into contact with each other at an edge, a groove formed at the edge of the cover and a protrusion formed at the edge of the base, and the groove and the protrusion are formed to be spaced apart from each other at a predetermined space in which a sealing member is applied.

The groove and the projection may be formed to be inclined at a predetermined angle.

The sealing member may be bonded with the cover, the PCB, and the base at three points.

According to the exemplary embodiment of the present disclosure, a sufficient sealing area is secured between the cover and the base, thereby providing the electronic control apparatus for a vehicle having a further rigid sealing structure.

The foregoing summary is illustrative only and is not intended to be in any way limiting. In addition to the illustrative aspects, embodiments, and features described

DETAILED DESCRIPTION

Figure 1:
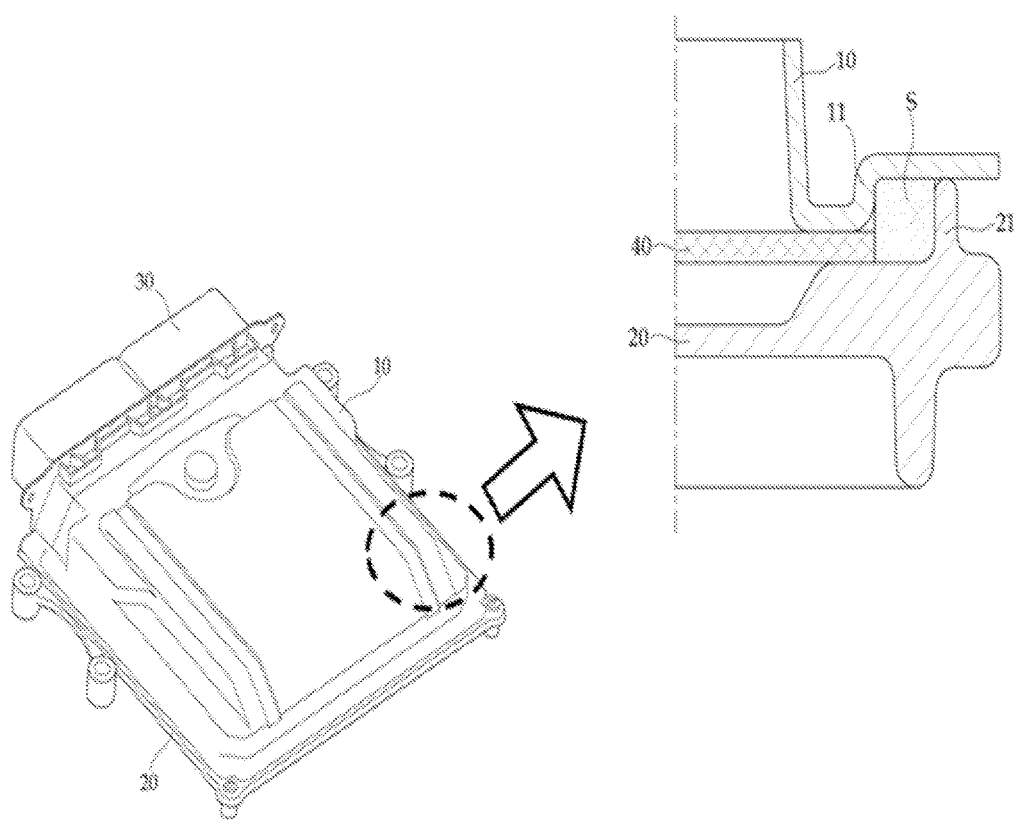
FIG. 1 shows a coupled perspective view of an electronic control apparatus for a vehicle according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments according to the present disclosure will be described in detail with reference to the accompanying drawings. A configuration of the present disclosure and an operation and an effect according to the configuration of the present disclosure will be clearly understood by the detailed description below. In the following description, the same elements will be designated by the same reference numerals although the elements are illustrated in different drawings, and a detailed explanation of publicly known related configurations may be omitted so as to avoid unnecessarily obscuring the subject matter of the present disclosure.

FIG. 1 is a coupled perspective view of an electronic control apparatus for a vehicle according to an exemplary embodiment of the present disclosure.

As illustrated, the electronic control apparatus refers to a component having an electronic control element, for example, integrated control circuit means, such as a printed circuit board (PCB), which electrically controls each part of a vehicle, and requires a tight sealing structure so as to prevent external moisture or foreign substances from flowing into the electronic control apparatus.

To this end, a cover 10 and a base 20, which are combined with each other in an up and down direction while accommodating a board such as the PCB therein, are provided, and a connector 30 is coupled to front portions of the cover 10 and the base 20 which are combined as described above. The connector 30 is coupled together with the cover 10 and the base 20 while being interposed between the cover 10 and the base 20 through a rear end body portion when the cover 10 and the base 20 are coupled to each other in the up and down direction.

As illustrated in FIG. 1, the electronic control apparatus refers to the component having the electronic control element, for example, integrated control circuit means, such as the PCB with electronic components installed on a surface of the PCB, which electrically controls each part of the vehicle. The electronic control apparatus requires a heat radiating structure for radiating heat, which is generated from the electronic components such as capacitors mounted on the PCB, to the outside of the electronic control apparatus. The electronic control apparatus requires a sealing structure for preventing external moisture or foreign substances from flowing into the electronic control apparatus.

Figure 2:
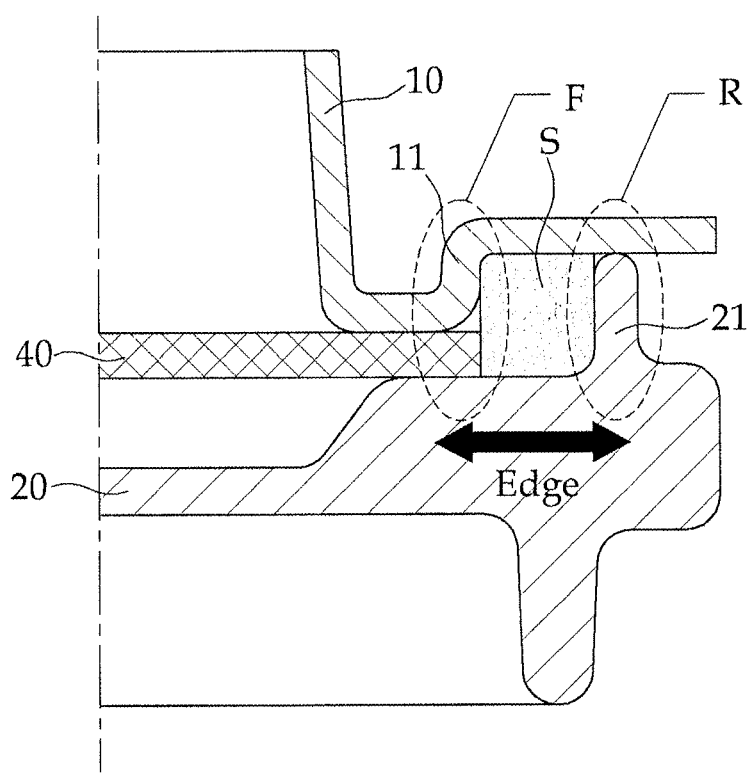
FIG. 2 shows a cross-sectional view illustrating the electronic control apparatus for a vehicle according to the exemplary embodiment of the present disclosure.

FIG. 2 is a cross-sectional view illustrating the electronic control apparatus for a vehicle according to the exemplary embodiment of the present disclosure.

As illustrated, an electronic control element is mounted between the cover 10 and the base 20. The electronic control element includes a PCB 40 and heating elements which are positioned on one or both surface of the PCB. The electronic control element controls electrically each part of the vehicle.

Although not illustrated, in order for the heating elements to radiate heat, a heat radiating plate is attached to the other surface of the PCB, which is opposite to the one surface portion on which the heating elements are positioned. Here, the heating elements may be positioned at a top side or a bottom side of the PCB. In a case in which the heating elements are positioned at the top side of the PCB, the heat radiating plate is attached to the bottom side of the PCB. On the contrary, in a case in which the heating elements are positioned at the bottom side of the PCB, the heat radiating plate is attached to the top side of the PCB.

The connector 30 has a connector pin, and is coupled to the electronic control element.

The cover 10 and the base 20 form a predetermined space so as to accommodate the PCB and various types of components in the space, and end portions of the cover 10 and the base 20 come into contact with each other. In this case, the end portions of the cover 10 and the base 20 form a predetermined gap so that the PCB 40 may be mounted between the cover 10 and the base 20, and surfaces of the end portions correspond to each other.

As illustrated, a protrusion 11 is formed at a front end portion F of an edge of the cover 10, and the PCB 40 is inserted and mounted between the protrusion 11 of the cover 10 and a front end portion F of an edge of the base 20.

A projection portion 21 is formed at a rear end portion R of the edge of the base 20 where the cover 10 and the base 20 come into contact with each other.

Therefore, a predetermined space S into which a sealing member may be inserted is formed between the protrusion 11 at the front end portion F of the edge of the cover 10 and the projection portion 21 at the rear end portion R of the edge of the base 20. The predetermined space S suggested in the present exemplary embodiment refers to a sealing space in which the sealing member may be applied, and may have an area that is enlarged in comparison with that in the related art so as to improve sealing performance.

That is, a sufficient sealing space is not secured in the related art because a groove and a protrusion of a cover and a base is formed into a sealing space. However, according to the present exemplary embodiment, recessed portions of the cover and the base are not formed in the sealing space S, and a sufficient space in which the sealing member may be applied may be secured.

When the sealing member is applied in the sealing space S, the sealing member may be bonded with the cover 10, the PCB 40, and the base 20 at three points, thereby providing a tight bonding structure.

Figure 3:
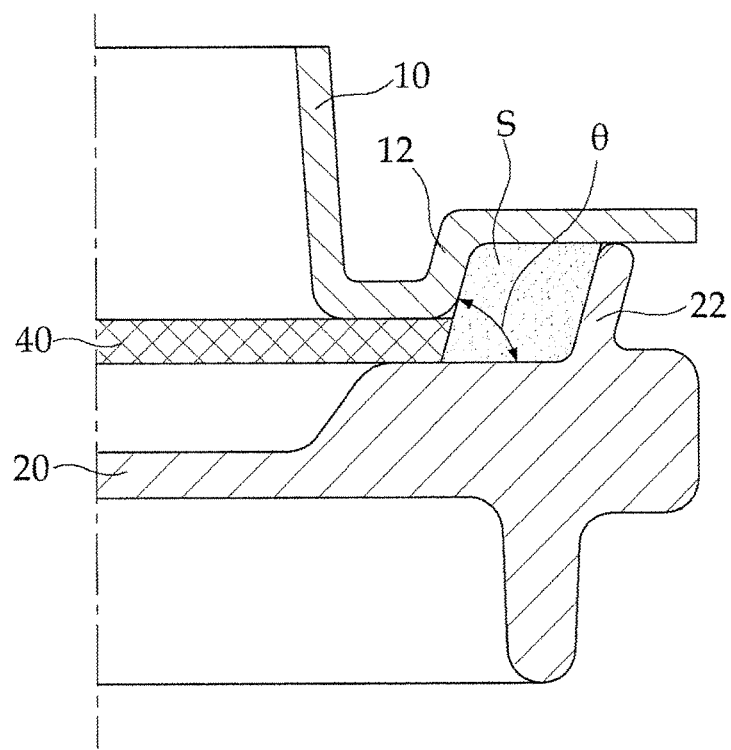
FIG. 3 shows a cross-sectional view illustrating an electronic control apparatus for a vehicle according to another exemplary embodiment of the present disclosure.

FIG. 3 is a cross-sectional view illustrating an electronic control apparatus for a vehicle according to another exemplary embodiment of the present disclosure.

A structure of the exemplary embodiment illustrated in FIG. 3 is basically identical to the structure of the exemplary embodiment that has been described with reference to FIG. 2. In order to more sufficiently secure a sealing space S, a protrusion 12 at a front end portion of an edge of a cover 10 and a projection portion 22 at a rear end portion of an edge of a base 20 are formed to have a predetermined angle θ.

In this case, in order to sufficiently secure the sealing space S, only the prevention protrusion 12 of the cover 10 may have an angle, or both the prevention protrusion 12 of the cover 10 and the projection portion 22 of the base 20 may have angles.

The projection portion 22 of the base 20 may be configured to have a gradually curved shape, and thereby, the angle may be naturally formed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electronic control apparatus for a vehicle, comprising:
    an electronic control element which includes a printed circuit board (PCB) and electronic components installed on a surface of the PCB;
    a cover and a base which accommodate the electronic control element; and
    a connector which is coupled to the electronic control element,
    wherein a protrusion of the cover is formed at a front end portion of an edge of the cover so that the PCB is inserted and mounted between the protrusion of the cover and an edge of the base, the PCB contacts the cover and the base so as to close a space between the front end portion of the edge of the cover and the edge of the base where the closed sealing space is formed by the protrusion of the cover, the PCB, the edge of the cover, and the edge of the base,
    wherein a projection of the base is formed at a rear end portion of the edge of the base where the cover and the base come into contact with each other, and the cover and the projection of the base come into contact with each other so as to form the closed sealing space between the protrusion of the cover formed at the front end portion of the edge of the cover and the projection of the base formed at the rear end portion of the edge of the base so that a sealing member is inserted into the closed sealing space, and
    wherein the cover and the projection of the base come into contact with each other to the extent that the PCB is inserted and mounted between the protrusion of the cover and the edge of the base at the front end portion.

2. The electronic control apparatus of claim 1, wherein at least one of the protrusion of the cover and the projection of the base is formed to be inclined at a predetermined angle.

3. The electronic control apparatus of claim 1, wherein the cover, the PCB, and the base are bonded at the predetermined space through the sealing member.

* * * * *